United States Patent [19]
Quintana

[11] Patent Number: 5,086,004
[45] Date of Patent: Feb. 4, 1992

[54] ISOLATION OF LAYERED P-N JUNCTIONS BY DIFFUSION TO SEMI-INSULATING SUBSTRATE AND IMPLANTATION OF TOP LAYER

[75] Inventor: Victor E. Quintana, Cambridge, Mass.

[73] Assignee: Polaroid Corporation, Cambridge, Mass.

[21] Appl. No.: 534,654

[22] Filed: Jun. 1, 1990

Related U.S. Application Data

[62] Division of Ser. No. 167,780, Mar. 14, 1988, Pat. No. 4,956,683.

[51] Int. Cl.$^5$ .................... H01L 21/76; H01L 21/265
[52] U.S. Cl. .......................................... 437/22; 437/23; 437/24; 437/63
[58] Field of Search ......................... 437/22, 23, 29, 63

[56] References Cited

U.S. PATENT DOCUMENTS

| | | | |
|---|---|---|---|
| 3,586,592 | 11/1968 | MacRae | 437/24 |
| 3,897,273 | 7/1975 | Marsh et al. | 437/24 |
| 4,198,251 | 4/1980 | Gaffre | 148/175 |
| 4,275,403 | 6/1981 | Lebailly | 357/17 |
| 4,290,825 | 9/1981 | Dearnaley et al. | 437/24 |
| 4,473,938 | 10/1984 | Kobayashi et al. | 29/569 L |
| 4,532,694 | 8/1985 | Kolbas | 29/569 L |
| 4,610,731 | 9/1986 | Chevallier et al. | 437/75 |
| 4,879,250 | 11/1989 | Chan | 437/127 |

FOREIGN PATENT DOCUMENTS

| | | | |
|---|---|---|---|
| 54648 | 6/1982 | European Pat. Off. | 437/24 |
| 0146877 | 3/1981 | Fed. Rep. of Germany | 437/24 |
| 2180540 | 11/1973 | France | 437/22 |
| 53-014585 | 2/1978 | Japan | 437/75 |
| 54-146982 | 11/1979 | Japan | 437/24 |
| 58-86789 | 5/1983 | Japan | 437/24 |
| 50-225580 | 12/1984 | Japan | 437/127 |
| 1107552 | 4/1989 | Japan | 437/24 |

OTHER PUBLICATIONS

Blem, J., "Solid State Light—Emitting Diodes", *IBM Technical Disclosure Bulletin*, Feb. 1971.
"Dual Wavelength Surface Emitting InGaAsP L.E.D.S", by T. Lee et al., Electron. Lett., vol. 34, 1980, pp. 401–402.
"A GaAsP Planar Monolithic 5×7 Matrix Alphanumeric Display", by S. Wako et al., 1973 IEEE International Solid State Circuits Conference, p. 94.
"Large High-Density Monolithic XY-Addressable Arrays for Flat-Panel LED Displays", by B. Frescura et al., IEEE Trans. Elec. Dev., vol. ED-24, No. 7, Jul. 1977, pp. 891–897.
"Monolithic GaP Green-Emitting LED Matrix-Addressable Arrays", by D. Keune et al., IEEE Trans. Elec. Dev., vol. ED-20, No. 11, Nov. 1973, pp. 1074–1077.
"Monolithic Matrix-Addressable AlGaAs-GaAs Array", by S. Ray et al., IEEE Trans. Elec. Dev., vol. ED-33, No. 6, Jun. 1986, pp. 845–849.

*Primary Examiner*—Olik Chaudhuri
*Assistant Examiner*—G. Fourson
*Attorney, Agent, or Firm*—Edward S. Roman

[57] ABSTRACT

An isolation structure and method of fabrication thereof for use in isolation of p-n junctions and for use in multiplexed, multi-color LED arrays. The isolation structure is fabricated on a structure which has a p-n junction formed on a semi-insulating substrate by (1) diffusing dopants into predetermined regions thereof from the top of the structure to the semi-insulating substrate, the dopants being of the same dopant type as that contained in the top layer of the p-n junction and (2) ion-implanting predetermined regions of the top layer of the p-n junction to render them non-conductive.

1 Claim, 4 Drawing Sheets

ISOLATION OF LAYERED P-N JUNCTIONS BY DIFFUSION TO SEMI-INSULATING SUBSTRATE AND IMPLANTATION OF TOP LAYER

This is a division of application Ser. No. 167,780, filed Mar. 14, 1988 now U.S. Pat. No. 4,956,683.

TECHNICAL FIELD OF THE INVENTION

The present invention pertains to an isolation structure and method of fabrication thereof for use in isolating p-n junctions and, in particular, to an isolation structure and method of fabrication thereof which is compatible with planar processing.

BACKGROUND OF THE INVENTION

In the fabrication of semiconductor devices and integrated circuits, it is often desirable to electrically isolate one device or portion of a circuit from another. As described in an article entitled "Large High-Density Monolithic XY-Addressable Arrays For Flat-Panel LED Displays" by B. L. Frescura, H. Luechinger, and C. A. Bittmann" in *IEEE Trans. Elec. Dev.*, Vol. ED-24, No. 7, July, 1977, pp. 891-897 ("Frescura et al"), at p. 893, there are four basic isolation structures that are presently used in the prior art for accomplishing this. These isolation structures are referred to as: (1) an air isolation structure; (2) a dielectric isolation structure; (3) a junction isolation structure; and (4) a resistive isolation structure.

Each of these prior art isolation structures suffer from one or more drawbacks. As an example, one drawback of the air isolation structure occurs because a conducting layer is etched through to produce a non-planar semiconductor surface. The resulting non-planar semiconductor surface can make subsequent processing difficult. As another example, one drawback of the dielectric isolation structure is that it often needs to be fabricated by a complicated process which may not be compatible with planar processing. As a result, subsequent processing may be difficult. As yet another example, one drawback of the junction isolation structure is that it cannot be used with non-localized p-n junctions because either the p-type or n-type semiconductor will be of the same type as the diffused area and a continuous conduction path will be formed therethrough. As still yet another example, one drawback of the most common and effective resistive isolation structure, which structure makes the semiconductor resistive by introducing mid-gap states by ion implantation, is that there are limits to the depths that can be reached by ion implantation. As a result, this renders a resistive isolation structure inapplicable in many cases.

As a result, there is a need in the art for an isolation structure and a method of fabrication thereof for use in isolating p-n junctions which is applicable for use with non-localized p-n junctions and which is compatible with planar processing even when the conducting epitaixial layer is relatively thick.

Closely coupled with the need to provide electrical isolation structures is a need in the art to fabricate multiplexed LED arrays. Most previous multiplexed arrays have been fabricated by forming localized p-n junctions by diffusion and by isolating them by means of a junction isolation structure formed by diffusion. Such multiplexed arrays have been disclosed in the Frescura et al article and in an article entitled "Monolithic GaP Green-Emitting LED Matrix-Addressable Arrays" by D. L. Keune, M. G. Craford, W. O. Groves, and A. D. Johnson in *IEEE Trans. Elec. Dev.*, Vol. ED-20, No. 11, November 1973, pp. 1074-1077. The method of forming localized p-n junctions by diffusion limits the class of devices that can be simply processed to homojunctions. On the other hand, while an epitaxially grown p-n junction has many well-recognized desirable features, these advantages cannot be utilized in conjunction with a diffused isolation structure because this method yields full-surface p-n junctions. In order to utilize epitaxially grown p-n junctions in a monolithic circuit requiring electrical isolation, a method must be found to localize the regions of light emission and a structure must be found to electrically isolate the sections of the LED array because, as described above, junction isolation cannot be used to provide electrical isolation of different sections of such an LED array.

One choice of an electrical isolation structure which is compatible with planar processing technology is a resistive isolation structure which is formed by ion implantation. Such a structure is disclosed in an article entitled "Monolithic Matrix-Addressable AlGaAs-GaAs Array" by S. Ray, R. M. Kolbas, M. J. Hafich and B. E. Dies, *IEEE Trans. Elec. Dev.*, Vol. ED-33, No. 6, June 1986, pp. 845-849 ("Ray et al"). However, as discussed above, there are limits to the depths that can be reached by ion implantation. These limits arise, in part, from the difficulty in fabricating implant masks which are thick enough to protect areas which are not intended for implantation and, in part, from limitations on ion energies that are available. These limits, in turn, constrain the design of the device.

Still further, and also closely coupled with the need to provide electrical isolation structures and multiplexed LED arrays, is a need in the art to fabricate multi-color LED arrays. For example, there have been several attempts in the prior art to fabricate two-color LED arrays. One prior method for fabricating two-color LED arrays was disclosed in U.S. Pat. No. 4,198,251. As disclosed in FIG. 1 of the patent, this method relies on doping level to provide a variation in bandgap such that more heavily doped layers, for example, layer 2A in FIG. 1, have a smaller bandgap than more lightly doped layers, for example, layer 2B in FIG. 1. As a result, light emitted in the heavily doped layers will not be absorbed as it travels through more lightly doped layers. Thus, the heavily doped layers are placed beneath more lightly doped layers to increase emission from the LED surface. In this method, a p-n junction is formed by diffusing a p-type dopant species into n-type epitaxially grown layers to the appropriate depth. However, the disclosed method has a drawback which is caused when the diffusion extends through the high bandgap material and into the smaller bandgap material, for example, region 6 in FIG. 1. As a result of this, a p-n junction exists along the edges of the diffused region, not only in the small bandgap material, but also in the higher bandgap material. For this reason, carriers may be injected into both the high and low bandgap materials simultaneously, thereby reducing the efficiency of the intended emission.

Another prior art method for fabricating two-color LED arrays, disclosed in an article entitled "Dual Wavelength Surface Emitting InGaAsP L.E.D.s" by T. P. Lee, C. A. Burrus, and A. G. Dentai in *Electron. Lett.*, Vol. 34, 1980, pp. 401-402, avoids the above-described problem of unintended injection into a higher bandgap material by using a mesa etch to isolate two LED devices. In addition, this method has the further advantage of using epitaxially grown p-n junctions. This is an advantage because epitaxially grown p-n junctions are inherently more efficient than diffused p-n junctions, which diffused p-n junctions are disclosed in the above-described patent. However, because the method disclosed in the article requires non-planar processing, fabrication is difficult and this fact limits the usefulness of the disclosed method in arrays of more than two LEDs.

As a result, there is a need in the art for multiplexed, multi-color LED arrays and a method of fabrication thereof which permits the use of epitaxially grown p-n junctions, which avoids the use of diffused p-n junctions and the resulting unintended injection along the walls of the diffusion, which utilizes an isolation structure which is compatible with planar processing, and which can use a single-level or a double-level metal addressing scheme.

SUMMARY OF THE INVENTION

Embodiments of the present invention are an isolation structure and a method of fabricating the same which is applicable for use with non-localized p-n junctions and which is compatible with planar processing. Further embodiments of the present invention comprise the use of the inventive isolation structure to form multiplexed, multi-color LED arrays and a method of fabricating the same.

The inventive isolation structure isolates p-n junctions which are grown on a semi-insulating substrate and comprises first and second predetermined regions. The first predetermined regions have had the same dopant type as exists in the top layer of the p-n junction diffused thereinto at least to the depth of the semi-insulating substrate and the second predetermined regions have been ion implanted to a depth which includes at least the top layer of the p-n junction in order to render the second predetermined regions substantially non-conductive. Note that the order in which the p-type and n-type layers is grown is interchangeable. The inventive isolation structure, which structure is particularly advantageous when used to provide isolation for epitaxially grown, non-localized p-n junctions, provides electrical isolation between isolated regions, i.e., regions between the deep diffusion, first predetermined regions, because: (1) there is substantially no conduction through the semi-insulating substrate; (2) conduction through the bottom layer of the p-n junction is substantially blocked under normal operating conditions by means of un-biased or reversed biased p-n junctions existing across the diffused regions; and (3) conduction through the top layer of the p-n junction is substantially blocked by the highly resistive, ion implanted, second predetermined regions. As a result, the inventive isolation structure combines the ability of the diffusion formed in the first predetermined regions to provide isolation to an arbitrary depth with the ability of the resistive structure formed by ion implantation in the second predetermined regions to provide isolation between two segments of a non-localized p-n junction. Further, and most advantageously, the electrical isolation is achieved in a structure where surface planarity is maintained.

Interconnect metal may be applied to the above-described structure by: patterning and contacting metal to the top layer of the p-n junction; selectively etching the implanted semiconductor to etch through the top layer of the p-n junction to expose the bottom layer of the p-n junction; and contacting metal to the exposed bottom layer of the p-n junction.

The above-described inventive isolation structure which is fabricated by means of a deep diffusion and a shallow ion implantation can be used to electrically isolate the class of structures which comprise a p-n junction into two or more parts. Further, the inventive isolation structure is advantageous for use when a conductive epitaxial layer thickness is greater than that which is easily implanted through, a thickness which is typically on the order of a few microns. As will also be readily appreciated, however, this thickness also constrains the depth of the top layer (either p-type or n-type) of structures which utilize the inventive isolation structure because this portion of the isolation structure is formed by ion implantation. However, the diffusion depth does not normally provide a constraint because, as is well known, the step of diffusion, within reasonable diffusion time limits, can extend to depths on the order of several microns.

Embodiments of the inventive isolation structure are advantageous over the structures known in the prior art because the inventive isolation structure does not require critical processes to be used in the fabrication thereof and, as a result, yields are improved. Further, if the first layer grown of a non-localized p-n junction is n-type semiconductor and the semi-insulating substrate converts to a conductive p-type (which occurrence is the typical mode of failure occurring in prior art isolation structures), an isolation structure fabricated in accordance with the present invention will still provide electrical isolation by means of an unbiased p-n junction.

One can also readily appreciate that the diffusion of the inventive isolation structure fills a role which is similar to that of the deep implant disclosed in the device design of the Ray et al article. This is important because the non-critical diffusion of the inventive isolation structure is easier to produce than the deep ion implant of the prior art. A further advantage for the inventive isolation structure over the prior art occurs because the depths achievable by diffusion are much greater than the depths achievable by ion implantation.

Further, in accordance with the present invention, the ion implantation provides the distinct advantage that the implant can be used to localize light emission in LED devices which utilize the inventive isolation structure.

Further embodiments of the present invention comprise the use of the inventive isolation structure to form multiplexed, multi-color LED arrays and, in particular, three-color LED arrays. The inventive multiplexed arrays are formed on a semi-insulating substrate and comprise a multiplicity of epitaxially grown layers wherein the active emitting layers are arranged in an order so that the layers emitting the longest wavelengths are closest to the substrate and the other layers are arranged so that layers emitting successively shorter wavelengths are successively farther from the substrate. This arrangement permits light emitted at the longer wavelengths to pass through the structure unabsorbed. Groups of three LEDs are electrically isolated by means of the inventive isolation structure and the ion implantation layer of this structure also serves to delineate areas of emission for the various LEDs in each electrically isolated group. In one embodiment, the addressing scheme utilizes a common cathode contact which is affixed to a highly conductive n-type layer formed on the semi-insulating substrate and separate anode contacts for each LED in the isolated group, which anode contacts are formed on a highly conductive cap layer. In this structure, the various p-n junctions for the LEDs are determined by various p-type diffusions, however, the possibility of unintended carrier injection along the sides of the diffusions is eliminated because of the inventive isolation structure. In fact, there is not even a conductive path through the higher bandgap layers.

BRIEF DESCRIPTION OF THE DRAWING

A complete understanding of the present invention may be gained by considering the following detailed description in conjunction with the accompanying drawing, in which.

To facilitate understanding, identical reference numerals are used to designate elements common to the figures.

DETAILED DESCRIPTION

Figure 1:
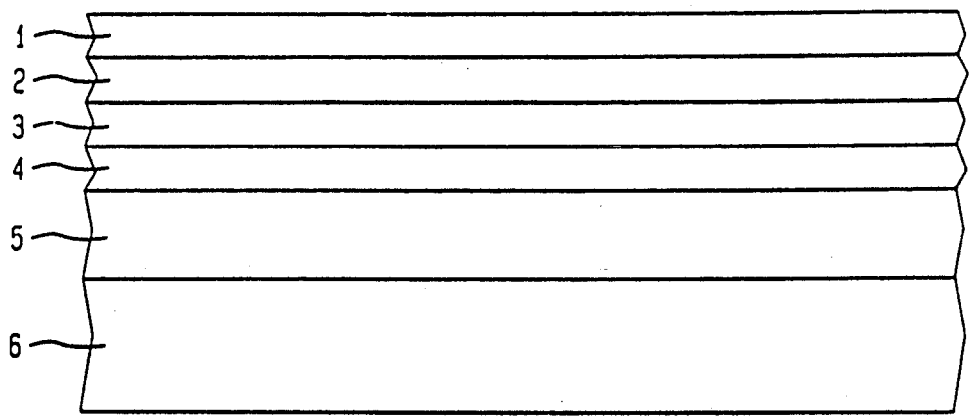
FIGS. 1-4 show, in pictorial form, cross-sections of a portion of a device at various stages of the fabrication thereof, which device comprises an inventive isolation structure for a p-n double heterojunction LED in a GaAs-AlGaAs system.

FIGS. 1-4 show, in pictorial form, cross-sections of a portion of a device at various stages of the fabrication thereof, which device comprises an inventive isolation structure for a p-n double heterojunction LED in a GaAs-AlGaAs system. In particular, FIG. 1 shows a cross-section of a portion of a structure comprising layers 1-5 which were epitaxially grown on semi-insulating GaAs substrate 6. As will be described below, the inventive isolation structure for the LED is fabricated on semi-insulating substrate 6 so that substantially no electrical conduction will take place in substrate 6.

Layer 5 is an n-type doped GaAs layer which will serve, as will be described below, as a conduction layer for use in applying electrical current to the LED. Layer 5 is relatively thick and is heavily doped to facilitate conduction and to allow it to play a role in the scheme for addressing the LED. The heavy doping also allows a good metal-semiconductor cathode connection to be made to this layer. In the embodiment shown in FIGS. 1-4, layer 5 is doped to a level of substantially $5 \times 10^{18}$ ions/cc, the dopant species being, for example, Se, and layer 5 is substantially 1 um thick. Layer 4 is an n-type doped AlGaAs layer having a high bandgap. As a result, layer 4 will serve, as is well known to those of ordinary skill in the art, as a high bandgap hole confinement layer for the p-n double heterojunction LED. In the embodiment shown in FIGS. 1-4, layer 4 is doped to a level of substantially $5 \times 10^{17}$ ions/cc, the fraction of Al in the AlGaAs alloy is substantially equal to 0.45, and layer 4 is substantially 1 um thick. Layer 3 is a substantially undoped AlGaAs layer which will serve, as is well known to those of ordinary skill in the art, as the active layer of the LED. In the embodiment shown in FIGS. 1-4, layer 3 has a fraction of Al in the AlGaAs alloy which is substantially equal to 0.24 and layer 3 is substantially 2000 Angstroms thick. Layer 2 is a p-type doped AlGaAs layer having a high bandgap which will serve, as is well known to those of ordinary skill in the art, as a high bandgap electron confinement layer for the LED. In the embodiment shown in FIGS. 1-4, layer 2 is doped to a level of substantially $5 \times 10^{17}$ ions/cc, the dopant species being, for example, Mg, the fraction of Al in the AlGaAs alloy is substantially equal to 0.45, and layer 2 is substantially 3000 Angstroms thick. Finally, layer 1 is a heavily, p-type doped (p+) GaAs layer to allow a good metal-semiconductor connection. Layer 1 is doped to a level of substantially $2 \times 10^{19}$ ions/cc and is substantially 2000 Angstroms thick. Layer 1 will serve, as will be described below, as a cap layer and to help provide anode contacts for the LED.

Methods are well known to those of ordinary skill in the art for fabricating semi-insulating GaAs substrate 6 and also for growing epitaxially thereupon the above-described layers 1-5. Further, methods are well known to those of ordinary skill in the art for providing the described dopant levels and thicknesses. Still further, it is well known to those of ordinary skill in the art which various ions may be used for achieving the desired n-type or p-type dopant levels.

Figure 2:
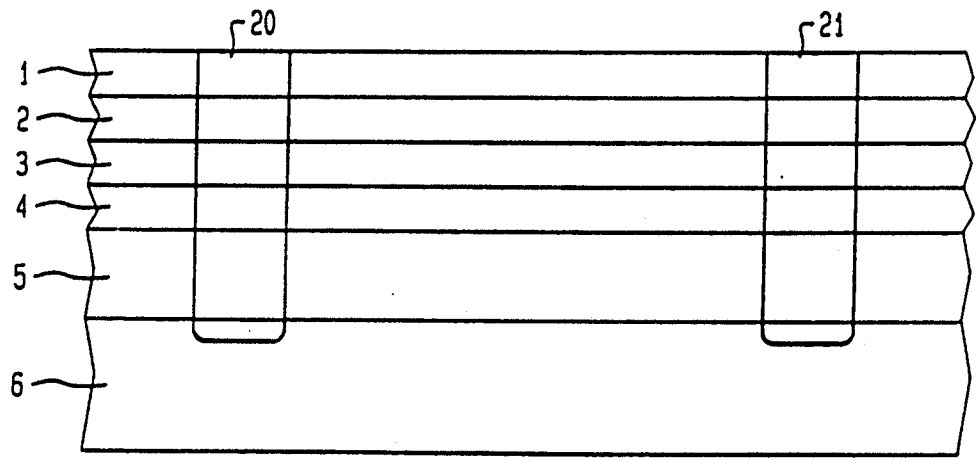

FIG. 2 shows the cross-section of the portion of the structure of FIG. 1 after several further processing steps were performed. A diffusion mask was patterned on the structure of FIG. 1 in accordance with methods well known to those of ordinary skill in the art, for example, by plasma etching a photolithographically defined dielectric mask. Then, a diffusant species which doped the semiconductor with the same dopant type as layer 2, in this case p-type, was diffused through layers 1-5 and into semi-insulating GaAs substrate 6 in accordance with methods well known to those of ordinary skill in the art to form regions 20 and 21. In this case, Zn is a preferred species for diffusion because it rapidly diffuses in GaAs and ternary AlGaAs alloys. It is important to note, as will be explained below, that the Zn diffusion should carry into semi-insulating substrate 6. It will be well understood that Cd could alternatively be used in place of Zn.

Figure 3:
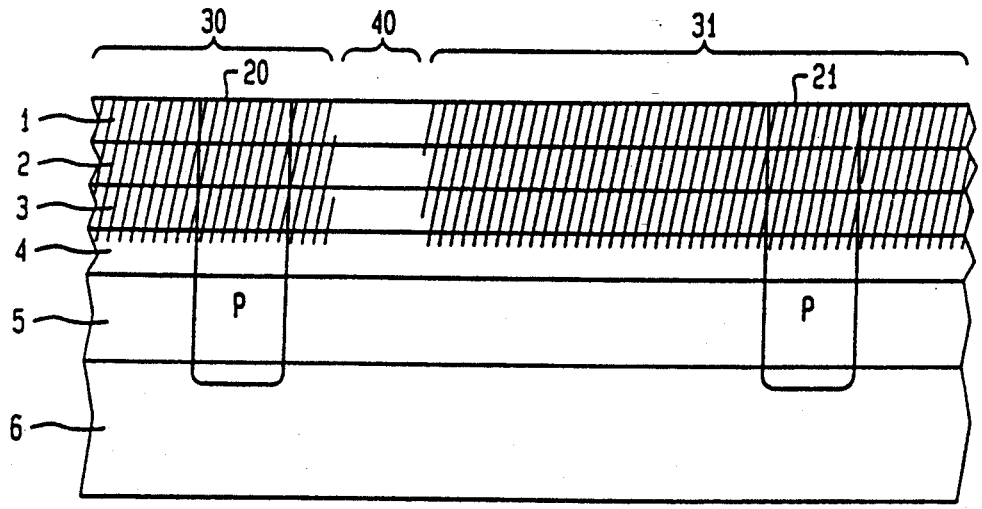

FIG. 3 shows the cross-section of the portion of the structure of FIG. 2 after several further processing steps were performed. An ion implant mask was patterned on the structure of FIG. 2 in accordance with methods well known to those of ordinary skill in the art and the structure was implanted to render the exposed sections 30 and 31 of layers 1-3 non-conductive to the depth of the top of layer 4. We have ion implanted with hydrogen (H+) but other ions which will provide the desired non-conductivity, such as, for example, oxygen or boron, are well known to those of ordinary skill in the art. As a result, exposed region 40 defines the emission area of the LED. After this step in the inventive method, the inventive isolation structure is complete and there is no longer an electrically conductive path between LEDs. This is because: (1) there is substantially no conduction through semi-insulating substrate 6; (2) conduction through the bottom epitaxial layer, layer 5, is blocked in normal operation by means of un-biased or reverse-biased p-n junctions existing across regions 20 and 21; and (3) conduction through top epitaxial layers 1-3 is blocked by highly resistive regions 30 and 31. As a result, the inventive isolation structure fabricated in accordance with the inventive method combines the ability of the diffusion structure, i.e., regions 20 and 21, to provide isolation to an arbitrary depth with the ability of the resistive structure, i.e., regions 30 and 31, to provide isolation between two segments of a non-localized p-n junction. Further, this electrical isolation is achieved while surface planarity is maintained.

Figure 4:
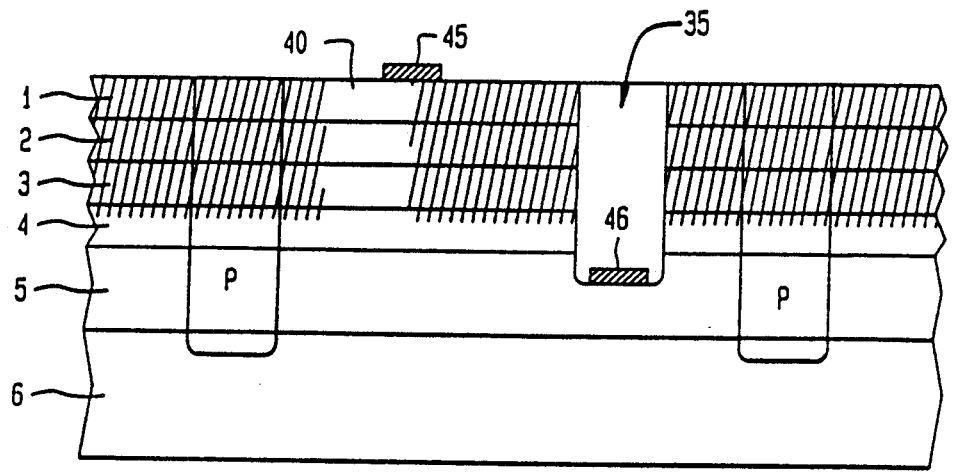

FIG. 4 shows the cross-section of the portion of the structure of FIG. 3 after several further processing steps were performed. In particular, the structure of FIG. 3 was patterned in accordance with methods well known to those of ordinary skill in the art and anode metal contact 45 was formed on cap layer 1, p-metallization, in accordance with methods well known to those of ordinary skill in the art. For example, the anode metal contact fabrication included a Ti/Au deposition to thicknesses of 250 Angstroms and 2500 Angstrom, respectively. The structure of FIG. 3 was further patterned in accordance with methods well known to those of ordinary skill in the art and well 35 was etched in accordance with methods well known to those of ordinary skill in the art to expose layer 5. Finally, cathode metal contact 46 was formed on layer 5, n-metallization, in accordance with methods well known to those of ordinary skill in the art. For example, the cathode metal contact fabrication included a Au/Sn/Au deposition to thicknesses of 1000 Angstroms, 500 Angstroms, and 1000 Angstrom, respectively. At this point, a p-n double heterojunction LED has been formed which will emit through exposed region 40.

Although we have described an embodiment of the inventive isolation structure for use with a device having a conduction layer 5 and a cap layer 1, these layers are not required for one to practice the present invention. Further, although we have described an embodiment of the inventive isolation structure for use with a p-n double heterojunction LED formed from layers 2-4, this is not required and the inventive isolation structure may advantageously be used to fabricate isolated p-n junctions. This will be described directly below.

Figure 5:
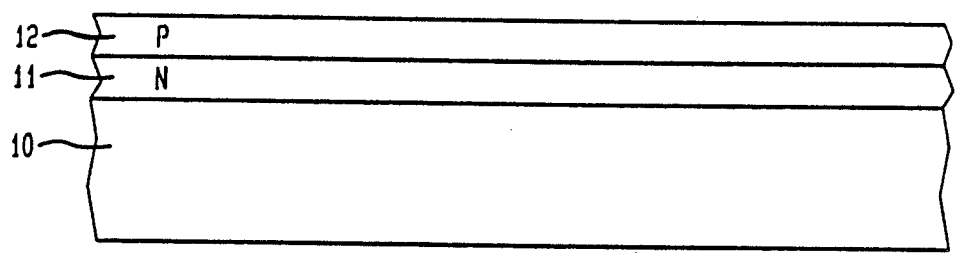
FIGS. 5-8 show, in pictorial form, cross-sections of a portion of a device at various stages of the fabrication thereof, which device comprises an inventive isolation structure for a p-n junction.
Figure 6:
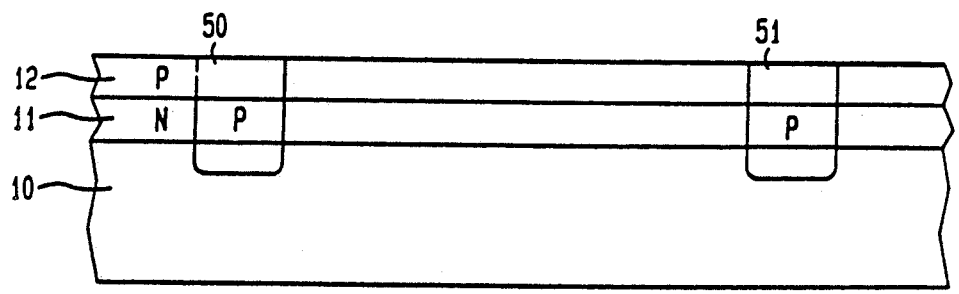

FIGS. 5-8 show, in pictorial form, cross-sections of a portion of a device at various stages of the fabrication thereof, which device comprises an inventive isolation structure for a p-n junction. In FIG. 5, layers 11 and 12 are epitaxially grown on semi-insulating substrate 10. Layer 11 is an n-type doped layer and layer 12 is a p-type doped layer but the order is interchangeable. The structure shown in FIG. 6, was produced from the structure shown in FIG. 5 after several further processing steps were performed. A diffusion mask was patterned on the structure of FIG. 5 in accordance with methods well known to those of ordinary skill in the art and a diffusant species which doped the semiconductor with same dopant type as top epitaxial layer 12 was diffused through both p-type layer 12 and n-type layer 11 in accordance with methods well known to those of ordinary skill in the art to form regions 50 and 51. Then, the structure shown in FIG. 7 was produced from the structure shown in FIG. 6 after several further processing steps were performed. An ion implant mask was patterned on the structure of FIG. 6 in accordance with methods well known to those of ordinary skill in the art and the structure was implanted to render the exposed areas 70 and 71 of layer 12 non-conductive to the depth of the top of epitaxial layer 11. After this step in the inventive method, the inventive isolation structure has been formed and there is no longer an electrically conductive path between isolated regions. This is because conduction through bottom epitaxial layer 11 under normal operating conditions is blocked by means of un-biased or reversed biased p-n junctions existing across regions 50 and 51. Further, conduction through top epitaxial layer 12 is blocked by highly resistive regions 70 and 71. As a result, the inventive isolation structure fabricated in accordance with the inventive method combines the ability of the diffusion structure, i.e., regions 50 and 51, to provide isolation to an arbitrary depth with the ability of the resistive structure, i.e., regions 70 and 71, to provide isolation between two segments of a non-localized p-n junction. Further, this electrical isolation is achieved while surface planarity is maintained.

It is especially advantageous to use the inventive isolation structure where the total conductive epitaxial layer thickness is greater than that which is easily implanted through, this thickness being on the order of a few microns for most cases. This implantation depth constrains the top layer (either p-type or n-type) of devices which utilize the isolation structure of the present invention, because this portion of the isolation structure is also formed by ion implantation. However, the diffusion depth does not normally provide a constraint because, as is well known to those of ordinary skill in the art, diffusion depths on the order of several microns can be achieved by choosing diffusion parameters within reasonable diffusion time limits.

Figure 7:
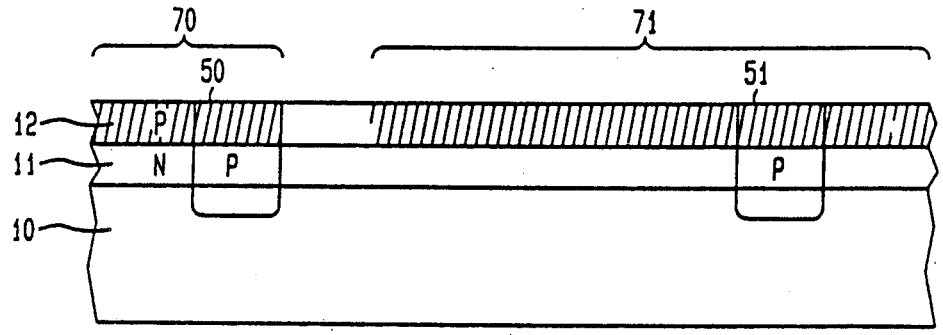
Figure 8:
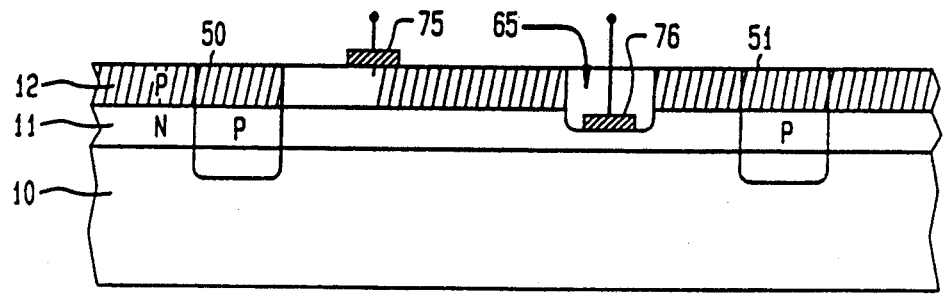

FIG. 8 shows the cross-section of the portion of the structure of FIG. 7 after several further processing steps were performed. In particular, the structure of FIG. 7 was patterned in accordance with methods well known to those of ordinary skill in the art and anode metal contact 75 was formed on layer 12, p-metallization, in accordance with methods well known to those of ordinary skill in the art. The structure of FIG. 7 was further patterned in accordance with methods well known to those of ordinary skill in the art and well 65 was etched in accordance with methods well known to those of ordinary skill in the art to expose layer 11. Finally, cathode metal contact 76 was formed on layer 11, n-metallization, in accordance with methods well known to those of ordinary skill in the art.

Figure 9:
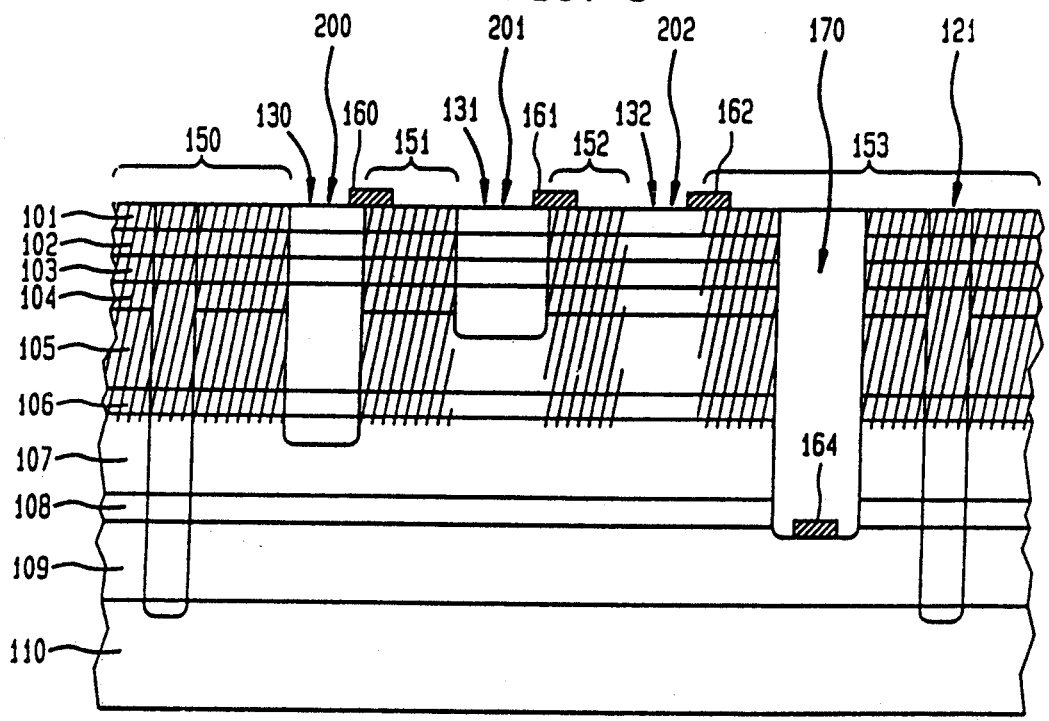
FIG. 9 shows, in pictorial form, a cross-section of a portion of a device which comprises an inventive, isolated three-color LED.

The above description focused on the inventive isolation structure and the method of fabrication thereof in connection with isolation of single LEDs or single p-n junctions. However, the inventive isolation structure may be advantageously used to fabricate multiplexed, multi-colored LED arrays. In particular, FIG. 9 shows, in pictorial form, a cross-section of a portion of a device which comprises an inventive, isolated three-color LED. In particular, FIG. 9 shows a portion of a structure comprised of layers 101-109 which were epitaxially grown on semi-insulating GaAs substrate 110. Layer 109 is an n-type doped GaAs layer which will serve, as will be described below, as a conduction layer for use in applying electrical current to LEDs 200-202. Layer 109 is relatively thick and is heavily doped to facilitate conduction and allow it to play a role in the scheme for addressing LEDs 200-202. The heavy doping also allows a good metal-semiconductor cathode connection to be made to this layer. In the embodiment shown in FIG. 9, layer 109 is doped to a level of substantially $5 \times 10^{18}$ ions/cc, the dopant species being, for example, Se, and layer 109 is substantially 1 um thick.

Layer 108 is an n-type doped AlGaAs layer having a relatively higher bandgap than that of layer 107. As a result, layer 108 will serve, as is well known to those of ordinary skill in the art, as a high bandgap confinement layer for 820 nm p-n double heterojunction LED 200. In the embodiment shown in FIG. 9, layer 108 is doped to a level of substantially $5 \times 10^{17}$ ions/cc, the fraction of Al in the AlGaAs alloy is substantially equal to 0.25, and layer 108 is substantially 2000 Angstrom thick. Layer 107 is an n-type doped AlGaAs layer having a composition such that emitted light has a wavelength substantially equal to 820 nm. As a result, layer 107 will serve, as is well known to those of ordinary skill in the art, as an active layer for 820 nm p-n double heterojunction LED 200. In the embodiment shown in FIG. 9, layer 107 is doped to a level of substantially $5 \times 10^{17}$ ions/cc, the fraction of Al in the AlGaAs alloy is substantially equal to 0.08, and layer 107 is substantially 1 um thick. Layer 106 is an n-type doped AlGaAs layer having a relatively higher bandgap than that of layers 107 and 105. As a result, layer 106 will serve, as is well known to those of ordinary skill in the art, as a high bandgap electron confinement layer for 820 nm p-n double heterojunction LED 200 and as a high bandgap hole confinement layer for 720 nm p-n double heterojunction LED 201. In the embodiment shown in FIG. 9, layer 106 is doped to a level of substantially $5 \times 10^{17}$ ions/cc, the fraction of Al in the AlGaAs alloy is substantially equal to 0.45, and layer 106 is substantially 2000 Angstroms thick. Layer 105 is an n-type doped AlGaAs layer having a composition such that emitted light has a wavelength substantially equal to 720 nm. As a result, layer 105 will serve, as is well known to those of ordinary skill in the art, as an active layer for 720 nm p-n double heterojunction LED 201. In the embodiment shown in FIG. 9, layer 105 is doped to a level of substantially $5 \times 10^{17}$ ions/cc, the fraction of Al in the AlGaAs alloy of layer 105 is substantially equal to 0.24, and layer 105 is substantially 1 um thick. Layer 104 is an n-type doped AlGaAs layer having a relatively higher bandgap than that of layers 105 and 103. As a result, layer 104 will serve, as is well known to those of ordinary skill in the art, as a high bandgap electron confinement layer for 720 nm p-n double heterojunction LED 201 and as a high bandgap hole confinement layer for 660 nm p-n double heterojunction LED 202. In the embodiment shown in FIG. 9, layer 104 is doped to a level of substantially $5 \times 10^{17}$ ions/cc, the fraction of Al in the AlGaAs alloy is substantially equal to 0.85, and layer 104 is substantially 2000 Angstroms thick. Layer 103 is a substantially undoped AlGaAs layer having a composition such that emitted light has a wavelength substantially equal to 660 nm. As a result, layer 103 will serve, as is well known to those of ordinary skill in the art, as an active layer for 660 nm p-n double heterojunction LED 202. In the embodiment shown in FIG. 9, the fraction of Al in the AlGaAs alloy of layer 103 is substantially equal to 0.37 and layer 103 is substantially 2000 Angstroms thick. Layer 102 is a p-type doped AlGaAs layer having a relatively higher bandgap than that of layer 103. As a result, layer 102 will serve, as is well known to those of ordinary skill in the art, as a high bandgap electron confinement layer for 660 nm p-n double heterojunction LED 202. In the embodiment shown in FIG. 9, layer 102 is doped to a level of substantially $5 \times 10^{17}$ ions/cc, the fraction of Al in the AlGaAs alloy is substantially equal to 0.85, and layer 102 is substantially 2000 Angstroms thick. Finally, layer 101 is a heavily, p-type doped (p+) GaAs layer to allow a good metal-semiconductor connection. Layer 1 is doped to a level of substantially $5 \times 10^{19}$ ions/cc and is substantially 2000 Angstroms thick. Layer 1 will serve, as will be described below, as a cap layer and to help provide anode contacts 160–162 for LEDs 200–202.

A diffusion mask was patterned on the structure to delineate deep-diffusion regions 120 and 121 in accordance with methods well known to those of ordinary skill in the art. Then a diffusant species which doped the semiconductor with the same dopant type as the top layer in the active p-n junctions, in this case p-type, was diffused through layers 101–109 and into semi-insulating GaAs substrate 110 in accordance with methods well known to those of ordinary skill in the art to form regions 120 and 121. In this case, Zn is a preferred species for diffusion because it rapidly diffuses in GaAs and ternary AlGaAs alloys. Then, in two stages, diffusion masks were patterned on the structure to delineate and diffuse regions 130–131, respectively, in accordance with methods well known to those of ordinary skill in the art. For example, a p-type diffusant species, Zn, was diffused: in the first diffusion stage through layers 101–106 and into layer 107 in region 130 in accordance with methods well known to those of ordinary skill in the art to form 820 nm LED 200 and in the second diffusion stage through layers 101–104 and into layer 105 in region 131 in accordance with methods well known to those of ordinary skill in the art to form 720 nm LED 201.

Next, an ion implant mask was patterned on the structure to delineate regions 150–153 in accordance with methods well known to those of ordinary skill in the art. The structure was implanted to render the exposed sections 150–153 of layers 101–106 non-conductive to the depth of the top of layer 107. We have ion implanted with H+ but other ions which will provide the desired non-conductivity, such as, for example, oxygen or boron, are well known to those of ordinary skill in the art. As a result, exposed region 130 defines the emission area of 820 nm LED 200, exposed region 131 defines the emission area of 720 nm LED 201, and exposed region 132 defines the emission area of 640 nm LED 202. After this step in the inventive method, the inventive isolation structure is complete and there is no longer an electrically conductive path between groups of three LEDs 200–202. Thus, it is seen that layers 102–104 comprise 640 nm LED 202, layers 104–106 comprise 720 nm LED 201, with layer 104 acting to confine both holes in 640 nm active layer 103 and electrons in 720 nm active layer 105. LED 201 at 720 nm is distinguished from LED 202 at 640 nm by the zinc diffusion which rendered layers 103 and 104 p-type in region 131, layers 101 and 102 were p-type initially. Note that, while the diffusion front in region 131 may extend into layer 105, this is not necessary. Further note that LED 201 is a true double-heterojunction because carriers are confined to active layer 105 by the higher bandgap layers 104 and 106. Layers 106–108 comprise 820 nm LED 200 which functions in a similar manner to 720 nm LED 201. In addition, in accordance with the present invention, the three emitting regions are arranged so that the epitaxial layers above each one are transparent to the light emitted from below. Segments of the array are electrically isolated from each other by the inventive isolation structure, i.e., by the combination of the semi-insulating substrate, the deep diffusion regions, and by the ion-implanted regions. In addition, the ion implantation regions also serve to localize the areas of light emission. In doing this, the possibility of unintended carrier injection along the sides of the diffusions is eliminated because there are no longer p-n junctions thereat and, in fact, there is not even a conduction path through the high bandgap layers.

Next, the structure was patterned in accordance with methods well known to those of ordinary skill in the art and anode metal contacts 160-162 were formed on cap layer 101, p-metallization, in accordance with methods well known to those of ordinary skill in the art. The structure was further patterned in accordance with methods well known to those of ordinary skill in the art and well 170 was etched in accordance with methods well known to those of ordinary skill in the art to expose layer 109. Finally, a common cathode metal contact 164 was formed on layer 109, n-metallization, in accordance with methods well known to those of ordinary skill in the art. At this point, three p-n double heterojunction LEDs 200-202 have been formed on semi-insulating substrate 110, which group of three LEDs is electrically isolated from other such groups of LEDs. Of course, it should be readily apparent to those of ordinary skill in the art that the present invention is not limited by the above-described embodiment to any particular choice of wavelengths or any particular number of LEDs in an isolated group.

Figure 10:
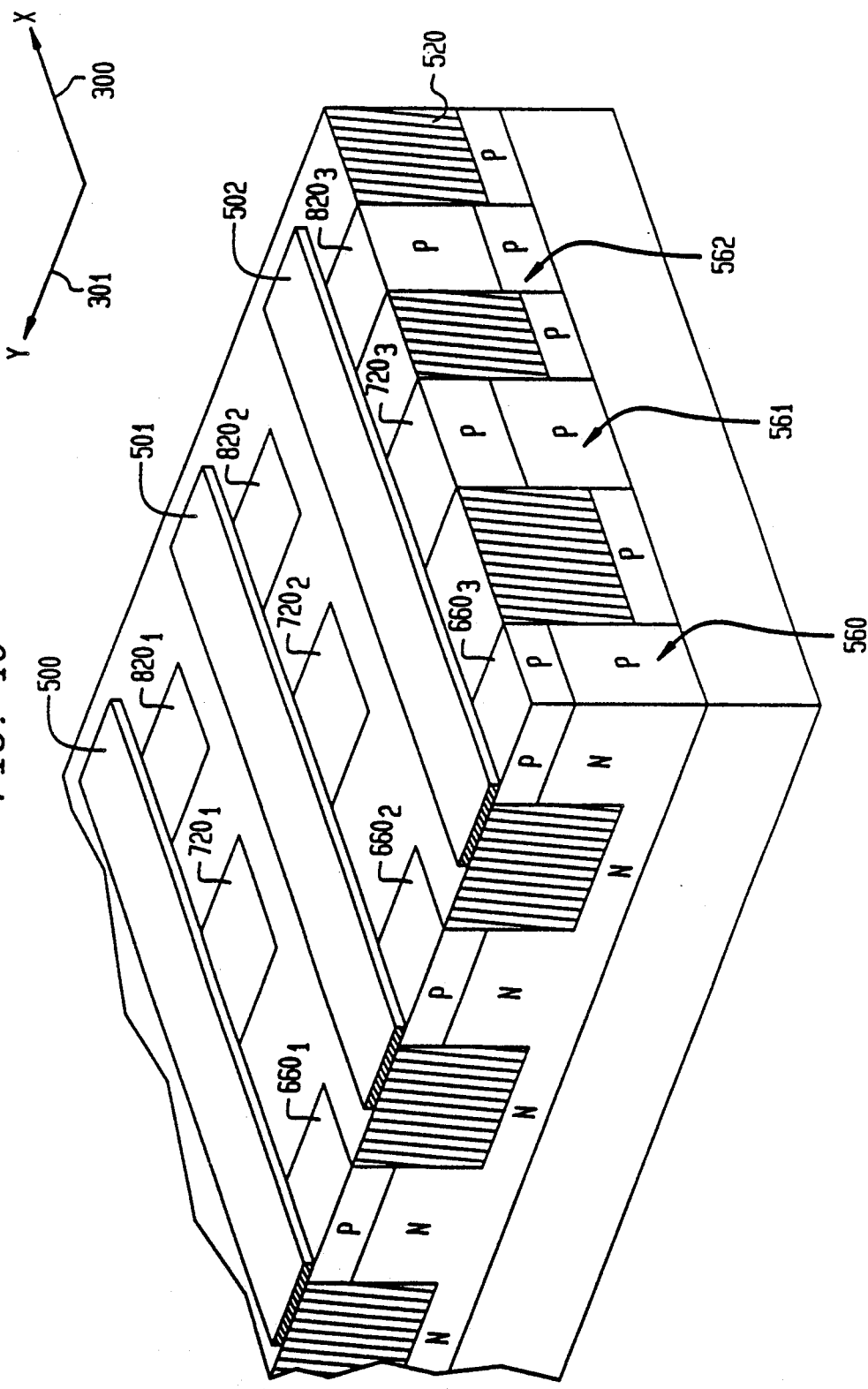
FIG. 10 shows, in pictorial form, a perspective view of the inventive, isolated three-color LED of FIG. 9 which illustrates a single-level-metal addressing scheme.

FIG. 10 shows, in pictorial form, a perspective view of the inventive, isolated three-color LED of FIG. 9 which illustrates a single-level metal addressing scheme. The structure shown in FIG. 10 is a 3×3 LED x-y matrix array where LEDs $660_1$, $660_2$, and $660_3$ all emit at a wavelength substantially equal to 660 nm; LEDs $720_1$, $720_2$, and $720_3$ all emit at a wavelength substantially equal to 720 nm; and LEDs $820_1$, $820_2$, and $820_3$ all emit at a wavelength substantially equal to 820 nm. The x-direction and the y-direction are denoted by arrows 300 and 301, respectively. Region 520 is the diffusion portion of the inventive isolation structure. Metal anodes 500-502 form common metal anodes in the x-direction for an LED of each color. Further, metal cathode electrodes are contacted at points 560-562, respectively, in etched wells (not shown in FIG. 10), to contact layer 109 shown in FIG. 9. As shown in FIG. 10, each color shares an n-GaAs cathode in the y-direction. Thus, a particular LED is addressed by energizing the appropriate anode along the x-direction and the appropriate cathode along the y-direction. Still further, a double-level metal addressing scheme could also be used with the embodiment shown in FIG. 9 as well.

Clearly, those skilled in the art recognize that further embodiments of the present invention may be made without departing from its teachings. As an example, since it is well known in the art that silicon or sulfur is an n-type diffusant species for GaAs/AlGaAs, in the above-described embodiment for a p-n junction, one can switch the order of the epitaxial layers and grow p-type layers first and the n-type layers on top and then replace the zinc diffusion with a silicon or sulfur diffusion. As a further example, the inventive isolation structure may be used to isolate devices in binary, ternary, and quaternary III-V compounds such as, for example, the alloys of InGaAsP, because zinc diffusions and oxygen implants will provide the appropriate isolation structure there as well. As a still further example, the inventive isolation structure may also be used to isolate various devices fabricated in silicon. Both n-type and p-type diffusion processes and ion implantation processes are well known to those of ordinary skill in the art for silicon materials. Therefore, it is intended that all matter contained in the above description or shown in the accompanying drawings shall be interpreted as illustrative and not limiting.

What is claimed is:

1. A method of forming an isolation structure for isolating regions of a non-localized p-n junction which is contained in a structure comprising a semi-insulating substrate and a plurality of stacked layers overlying each other with the innermost layer thereof overlying said semi-insulating substrate and doped with an impurity of a first conductivity type and an outermost layer doped with an impurity of a second conductivity type opposite to said first conductivity type so as to define said p-n junction between said innermost and outermost layers, which method comprises the steps of:

patterning a diffusion mask on the structure to delineate at least one first predetermined region;

diffusing an impurity having the same conductivity type as that of the outermost layer of the plurality of stacked layers to a depth that at least reaches the semi-insulating substrate;

patterning an ion implant mask onto the structure to delineate at least one second predetermined region, the second predetermined region comprising a portion of the first predetermined region; and ion implanting a substantially non-conductive impurity to a depth which includes the top layer of the p-n junction to render the second predetermined region substantially non-conductive.

* * * * *